US010285224B2

(12) United States Patent
Muto et al.

(10) Patent No.: US 10,285,224 B2
(45) Date of Patent: May 7, 2019

(54) MICROWAVE TREATMENT DEVICE

(75) Inventors: Keisuke Muto, Miyagi (JP); Tomotaka Nobue, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 1193 days.

(21) Appl. No.: 14/345,149

(22) PCT Filed: Sep. 14, 2012

(86) PCT No.: PCT/JP2012/005922
§ 371 (c)(1),
(2), (4) Date: Mar. 14, 2014

(87) PCT Pub. No.: WO2013/038715
PCT Pub. Date: Mar. 21, 2013

(65) Prior Publication Data
US 2015/0041458 A1    Feb. 12, 2015

(30) Foreign Application Priority Data

Sep. 16, 2011  (JP) ................................ 2011-202622

(51) Int. Cl.
*H05B 6/64* (2006.01)
*H05B 6/66* (2006.01)
(Continued)

(52) U.S. Cl.
CPC ........... *H05B 6/705* (2013.01); *G01R 21/002* (2013.01); *H05B 6/686* (2013.01); *H05B 6/808* (2013.01); *Y02B 40/143* (2013.01)

(58) Field of Classification Search
CPC ........ H05B 6/808; H05B 6/705; H05B 6/686; H05B 6/64–6/6402; H05B 6/6447; H05B 6/66–6/688; G01R 21/002
(Continued)

(56) References Cited

U.S. PATENT DOCUMENTS 6,763,062 B1 * 7/2004 Kohno ................. H01Q 3/2605
375/219
7,421,046 B2 * 9/2008 Wallace ............... H04B 7/0857
375/316
(Continued)

FOREIGN PATENT DOCUMENTS

JP         59-029397 A    2/1984
JP      2003-307317 A    10/2003
(Continued)

OTHER PUBLICATIONS

International Search Report for International Application No. PCT/JP2012/005922, dated Oct. 16, 2012, 2 pages.

*Primary Examiner* — Michael A Laflame, Jr.

(74) *Attorney, Agent, or Firm* — Brinks Gilson & Lione (57) ABSTRACT

A microwave processing apparatus is provided with an oscillator, a power amplifier, a heating chamber that accommodates an object to be heated, a power feeder which is disposed on a wall surface of the heating chamber, which receives an output transmitted from a microwave generator and which radiatively feeds the microwave into the heating chamber, and a power detector that detects the power reflected from the power feeder to the power amplifier. The microwave processing apparatus determines a plurality of points of heating frequencies by using top several points of minimum point frequencies of the reflected power, and performs frequency hopping heating within a predetermined unit time.

3 Claims, 5 Drawing Sheets

(51) Int. Cl.
*H05B 6/70* (2006.01)
*H05B 6/80* (2006.01)
*H05B 6/68* (2006.01)
*G01R 21/00* (2006.01)

(58) Field of Classification Search
USPC .................................................. 219/709, 721
See application file for complete search history.

(56) References Cited

U.S. PATENT DOCUMENTS

| | | |
|---|---|---|
| 2010/0176121 A1 | 7/2010 | Nobue et al. |
| 2010/0176123 A1* | 7/2010 | Mihara .................. H05B 6/686 |
| | | 219/746 |
| 2010/0243645 A1* | 9/2010 | Ishizaki ................. H05B 6/686 |
| | | 219/702 |
| 2011/0108548 A1 | 5/2011 | Nobue et al. |
| 2012/0111856 A1 | 5/2012 | Nobue et al. |

FOREIGN PATENT DOCUMENTS

| | | |
|---|---|---|
| JP | 2008-066292 A | 3/2008 |
| JP | 2008-108491 A | 5/2008 |
| WO | WO 2009/139136 A1 | 11/2009 |
| WO | WO 2009/157110 A1 | 12/2009 |
| WO | WO 2011/004561 A1 | 1/2011 |

* cited by examiner

MICROWAVE TREATMENT DEVICE

This application is a 371 application of PCT/JP2012/005922 having an international filing date of Sept. 14, 2012, which claims priority to JP2011-202622 filed Sept. 16, 2011, the entire contents of which are incorporated herein by reference.

TECHNICAL FIELD

The present invention relates to a microwave processing apparatus.

BACKGROUND ART

In related art, various microwave processing apparatuses of this type have been proposed for uniform heating of a portion to be heated. Regarding multiple power feeding, a radio-frequency heating apparatus has been proposed, in which the mode of a microwave generated by a magnetron is continuously changed by alternately closing two power feeding ports by sliding means formed of a solenoid or the like (for example, see Patent Document 1).

Moreover, regarding a cavity wall surface, a radio-frequency heating apparatus has been proposed, in which an uneven portion for reducing a contact area between an object to be heated and a bottom surface is formed (for example, see Patent Document 2).

RELATED ART DOCUMENTS

Patent Documents

Patent Document 1: JP-A-59-029397
Patent Document 2: JP-A-2003-307317

SUMMARY OF THE INVENTION

Problem to be Solved by the Invention

In the related-art radio-frequency heating apparatus, a mechanism parts such as a stirrer fan, a rotating table or a rotating antenna are added to stir the microwave incident into the heating chamber.

Moreover, the microwave is concentrated and diffused by a structure in which power is fed at a plurality of portions in the above-mentioned Patent Document 1 and by a structure in which the cavity wall surface is configured to be uneven in the above-mentioned Patent Document 2.

However, the addition of the rotating mechanism parts, the addition of power feeding portions and the processing of the cavity wall surface cause a detrimental effect of reducing the capacity of the heating chamber, and in addition, cost tends to increase, so that a result is produced that is contradictory to the requirement for miniaturization and cost reduction of the apparatus.

In order to solve the above-described related-art problem, an object of the present invention is to provide a microwave processing apparatus that realizes uniform heating without addition of mechanical parts or processing.

Means for Solving the Problem

To solve the above-mentioned related-art problem, the present invention provides a microwave processing apparatus including: a heating chamber that accommodates an object to be heated; an oscillator that outputs a source signal of a heating frequency; a power amplifier using a semiconductor element that power-amplifies an output of the oscillator; a power feeder that feeds an output of the power amplifier to the heating chamber; a power detector that detects incident power fed from the power amplifier to the power feeder and reflected power reflected from the power feeder to the power amplifier; and a controller that controls an oscillation frequency of the oscillator and the power amplifier, wherein the power feeder is disposed at least on a wall surface defining the heating chamber, and wherein the controller causes the power amplifier to perform a low output operation before start of heating, detects the reflected power detected by the power detector while changing the oscillation frequency of the oscillator in a predetermined frequency range, determines a plurality of points of heating frequencies of the oscillator by using top several points of minimum point frequencies of the detected reflected power, and performs frequency hopping heating within a predetermined unit time for the plurality of heating frequencies.

This enables temporal diffusion of the heating distribution, which produces an effect of preventing the object to be heated from being heated locally.

Moreover, the controller performs control such that the incident power for each of the frequencies on the object to be heated is substantially the same by multiplying time factors obtained based on the detected power information related to the extracted frequencies in microwave heating using top several points of minimum point frequencies of the extracted reflected power.

Consequently, although the reflected powers at the selected frequencies, that is, the intensities of the powers incident on the object to be heated are different, the load incident power per frequency is substantially the same by the weighting factors using the time factors of the frequencies, so that further improvement of finish quality in uniform heating is realized.

Moreover, although single power feeding and multiple power feeding are both effective technologies, the effect of preventing uneven heating is high particularly in a single power feeding type microwave processing apparatus having no microwave stirring mechanism.

Advantages of the Invention

The microwave processing apparatus of the present invention realizes uniform heating of the object to be heated only by system control by changing the heating distribution in the heating chamber without increase of a rotary mechanism or the heating chamber capacity by frequency hopping heating using a plurality of frequencies with low reflected power.

MODE FOR CARRYING OUT THE INVENTION

A first aspect of the invention provides a microwave processing apparatus including: a heating chamber that accommodates an object to be heated; an oscillator that outputs a source signal of a heating frequency; a power amplifier using a semiconductor element that power-amplifies an output of the oscillator; a power feeder that feeds an output of the power amplifier to the heating chamber; a power detector that detects incident power fed from the power amplifier to the power feeder and reflected power reflected from the power feeder to the power amplifier; and a controller that controls an oscillation frequency of the oscillator and the power amplifier, wherein the power feeder is disposed at least on a wall surface defining the heating chamber, and wherein the controller causes the power amplifier to perform a low output operation before start of heating, detects the reflected power detected by the power detector while changing the oscillation frequency of the oscillator in a predetermined frequency range, determines a plurality of points of heating frequencies of the oscillator by using top several points of minimum point frequencies of the detected reflected power, and performs frequency hopping heating within a predetermined unit time for the plurality of heating frequencies. This works to resolve uneven heating due to local concentration of the microwave on the object to be heated, by changing the microwave heating distribution in the heating chamber only by system control without addition of a microwave stirring mechanism such as a stirrer fan.

Consequently, addition of a mechanical part and processing become unnecessary, no detrimental effect that sacrifices the heating chamber capacity is caused, and further, no component cost is incurred, so that the above-mentioned working can be acquired without any cost increase. Moreover, the above-described structure produces, particularly in a microware processing apparatus of a single power feeding structure having no stirring mechanism, a great effect on the diffusion of the heating distribution since it is generally difficult to change the heating distribution.

According to a second aspect of the invention, particularly in the first aspect of the invention, the controller sets a predetermined threshold value for a ratio of the incident power to the reflected power calculated from the incident power fed from the power amplifier to the power feeder and the reflected power reflected from the power feeder to the power amplifier, and selects top several low points of the reflected power, that is, the ratio of the incident power to the reflected power, within a range not more than the threshold value, as the heating frequencies used for the frequency hopping heating. Thereby, highly efficient heating of the object to be heated is realized.

According to a third aspect of the invention, particularly in the first aspect of the invention, the controller determines a heating time of each heating frequency a per frequency hopping period by a time factor obtained based on detected power information of each of the plurality of heating frequencies. Thereby, the power absorbed into the object to be heated per heating frequency becomes substantially the same by making the heating time shorter for the heating frequencies where the reflected power is lower, that is, where the power absorbed into the object to be heated is higher and making the heating time longer for the heating frequencies where the reflected power is higher, that is, where the power absorbed into the object to be heated is lower, so that the object to be heated is prevented from being heated locally.

According to a fourth aspect of the invention, particularly in the third aspect of the invention, the controller performs control such that a load incident power for each of the plurality of heating frequencies is substantially the same in the frequency hopping heating using the time factor obtained based on the detected power information of each of the plurality of heating frequencies. Thereby, highly accurate uniform heating is realized.

Hereinafter, an embodiment of the present invention will be described with reference to the drawings. The present invention is not limited to the embodiment.

(First Embodiment)

Figure 1:
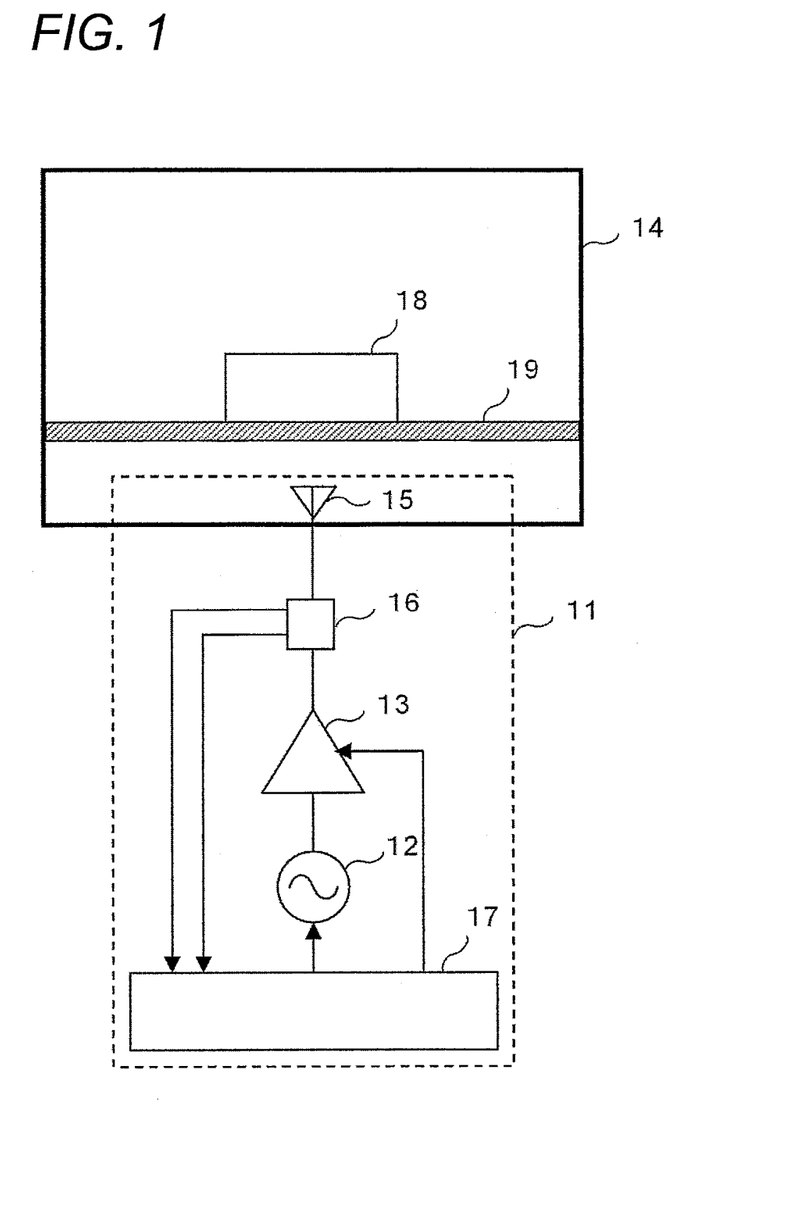
FIG. 1 is a configuration diagram of a microwave processing apparatus according to a first embodiment of the present invention.

FIG. 1 is a configuration diagram of a microwave processing apparatus according to a first embodiment of the present invention.

In FIG. 1, a microwave generator 11 includes an oscillator 12 structured by using a semiconductor element, a power amplifier 13 structured by using a semiconductor element that power-amplifies the output of the oscillator 12, a power feeder 15 that radiates the microwave output amplified by the power amplifier 13 into a heating chamber 14, a power detector 16 that is inserted on a microwave transmission path connecting the power amplifier 13 and the power feeder 15 and detects the power reflected from the power feeder 15 to the power amplifier 13 and the incident power fed from the power amplifier 13 to the power feeder 15, and a controller 17 that controls the power amplifier 13 by the incident power and the reflected power detected by the power detector 16.

Moreover, the microwave processing apparatus of the first embodiment has the heating chamber 14 formed of a substantially cuboidal structure accommodating an object to be heated 18, and the heating chamber 14 includes a left wall surface, a right wall surface, a bottom wall surface, an upper wall surface and a back wall surface made of a metal material, an open/close door (not shown) that opens and closes for accommodating the object to be heated 18 and a placement table 19 where the object to be heated 18 is placed, and is structured so as to trap the supplied microwave inside. And the power feeder 15 to which the output of the microwave generator 11 is transmitted and that radiatively feeds the microwave into the heating chamber 14 is disposed on a wall surface included in the heating chamber 14. While a view where the power feeder 15 is disposed on the bottom surface of the heating chamber 14 is shown in the present embodiment, the disposition of the power feeder is not restricted to that of the present embodiment but the power feeder may be disposed on any of the wall surfaces included in the heating chamber 14.

In the power amplifier 13, circuits are constructed by a conductive pattern formed on one surface of a dielectric substrate formed of a low dielectric loss material, and a matching circuit is disposed on each of the input side and the output side of each semiconductor element so that the semiconductor elements as amplification elements operate excellently.

The microwave transmission path connecting functional blocks forms a transmission circuit the characteristic impedance of which is substantially 50Ω by the conductive pattern provided on one surface of the dielectric substrate. Moreover, the power detector 16 extracts the power of a so-called reflected wave transmitted from the side of the heating chamber 14 to the side of the power amplifier 13 and the so-called incident power transmitted from the side of the power amplifier 13 to the side of the heating chamber 14, and with the power coupling degree being, for example, approximately −40 dB, extracts powers of approximately 1/10000 of the reflected power and the incident power. These power signals are each rectified by a detection diode (not shown) and smoothed by a capacitor (not shown), and the output signals thereof are inputted to the controller 17.

The controller 17 controls the driving power fed to each of the oscillator 12 and the power amplifier 13 which are components of the microwave generator 11, based on the heating condition for the object to be heated 18 directly inputted by the user or the heating information obtained from the heating state of the object to be heated 18 during heating and the detection information from the power detector 16, and optimally heats the object to be heated 18 accommodated in the heating chamber 14. Moreover, in the microwave generator 11, heat radiation means (not shown) is disposed for mainly radiating heat generated by the semiconductor elements provided in the power amplifier 13.

Figure 2:
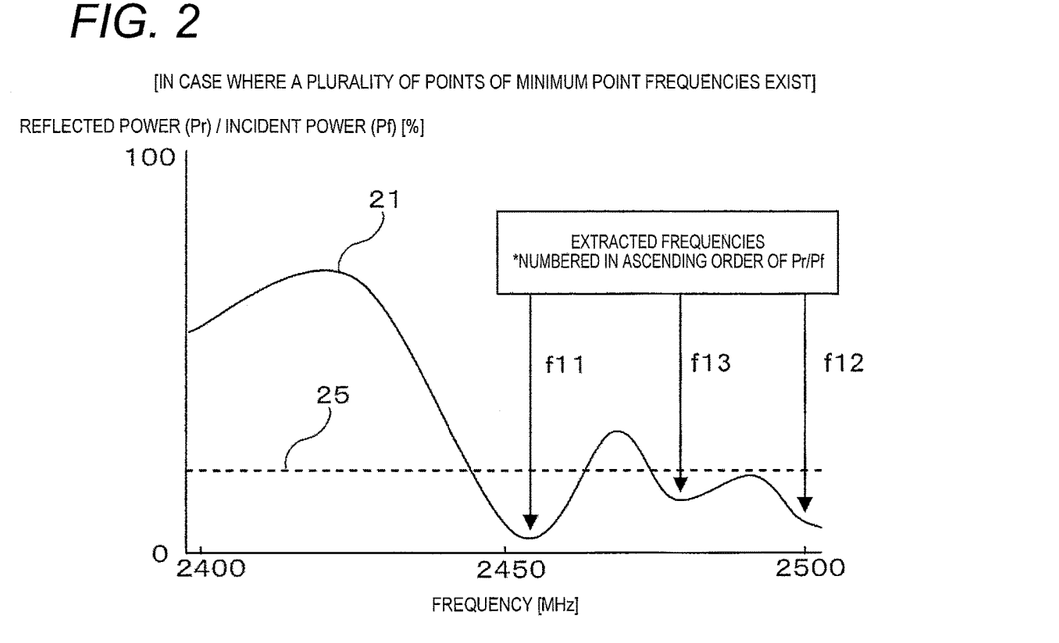
FIG. 2 is a power detection characteristic view of the microwave processing apparatus according to the first embodiment of the present invention.
Figure 3:
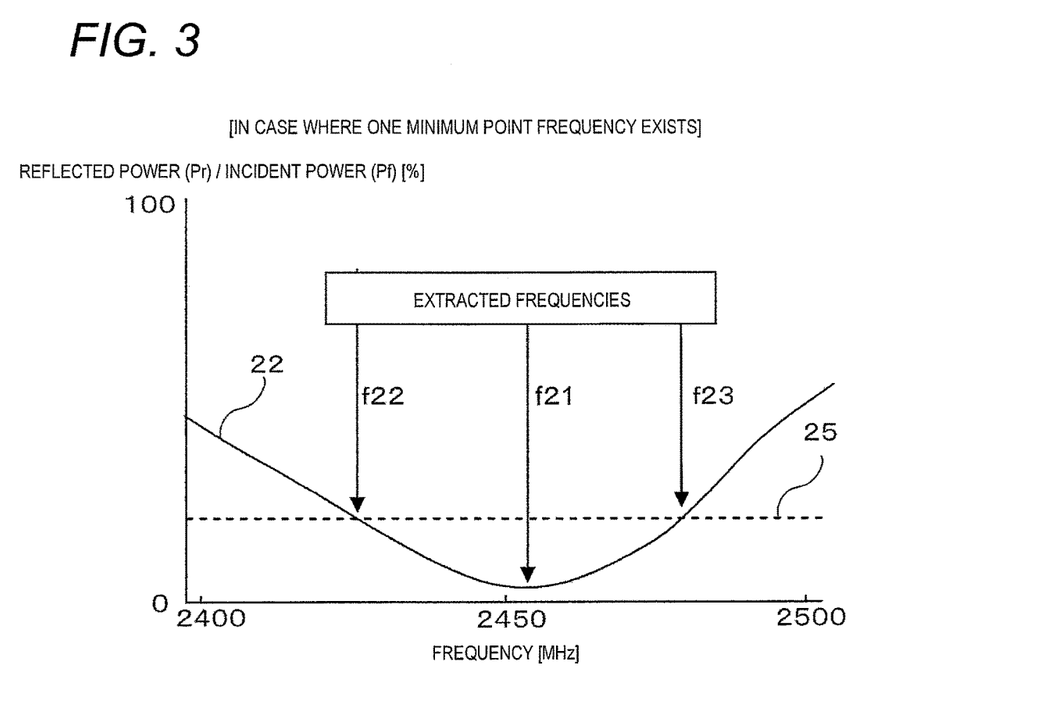
FIG. 3 is a power detection characteristic view of the microwave processing apparatus according to the first embodiment of the present invention.
Figure 4:
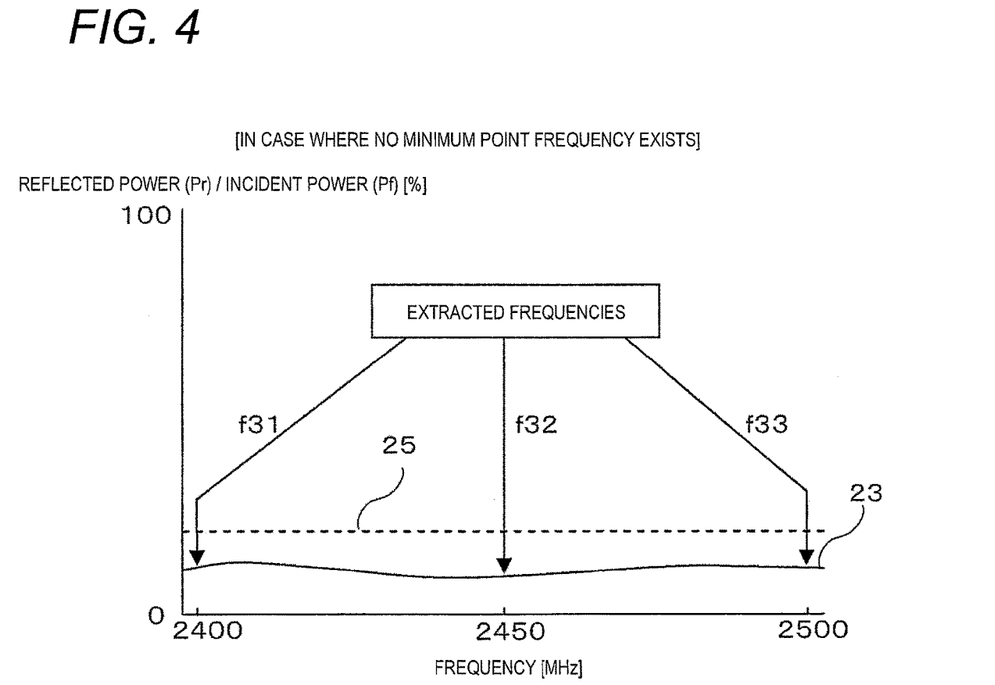
FIG. 4 is a power detection characteristic view of the microwave processing apparatus according to the first embodiment of the present invention.

FIG. 2 to FIG. 4 are power detection characteristic views for explaining a method of extracting a minimum point frequency. The figures are representative examples when a microwave is supplied into the heating chamber 14 accommodating different objects to be heated, respectively, and the curved lines each show in percent the proportion of the reflected power (Pr) to the incident power (Pf) calculated by the controller 17 based on the signals detected by the power detector 16 for the frequency band generated by the microwave generator 11, for example, 2400 to 2500 MHz. That is, the curved lines of FIG. 2 to FIG. 4 represent the reflected power (Pr)/incident power (Pf) ratios 21 to 23, respectively. Moreover, in the figures, the level of a predetermined threshold value 25 is indicated by the broken line.

FIG. 2 shows a case where there are a plurality of minimum points in the region of Pr/Pf lower than the threshold value 25. In the case of FIG. 2, the minimum point frequencies are set as f11, f12 and f13 in ascending order, and these frequencies are set as the heating frequencies used for the frequency hopping heating of the present invention.

FIG. 3 shows a case where there is only one minimum point in the region of Pr/Pf lower than the threshold value 25. In the case of FIG. 3, the minimum point frequency is set as f21, the intersections of the Pr/Pf characteristic curve and the threshold line on the low frequency side and on the high frequency side are set as f22 and f23, respectively, and these frequencies are selected as the heating frequencies used for the frequency hopping heating of the present invention.

FIG. 4 shows a case where there is no minimum point in the region of Pr/Pf lower than the threshold value 25. In the case of FIG. 4, the lowest frequency of the oscillation frequencies is set as f31, the intermediate frequency between the lowest frequency and the highest frequency is set as f32, the highest frequency is set as f33, and these frequencies are selected as the heating frequencies used for the frequency hopping heating of the present invention.

Figure 5:
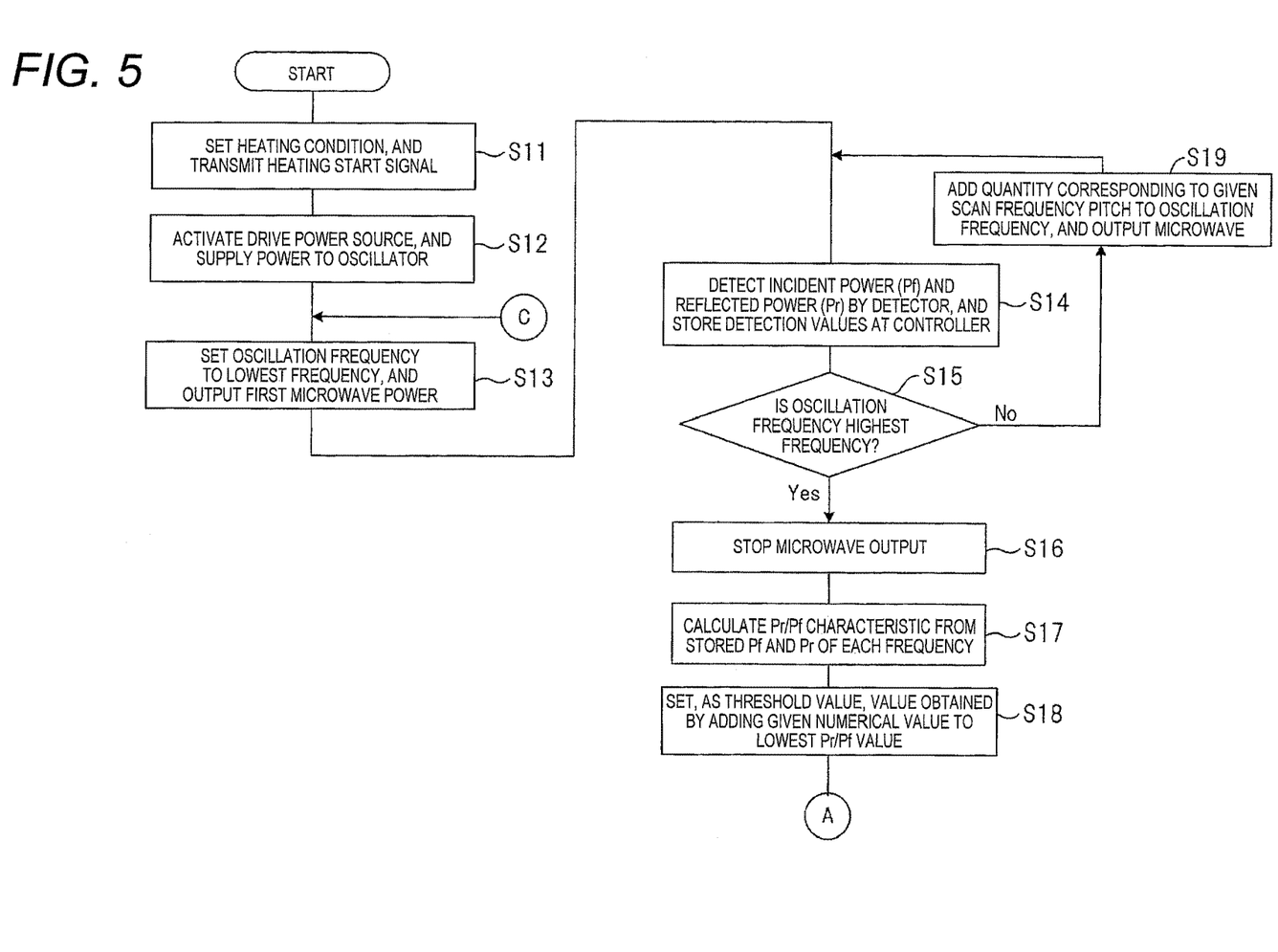
FIG. 5 is a control flowchart of the microwave processing apparatus according to the first embodiment of the present invention.
Figure 6:
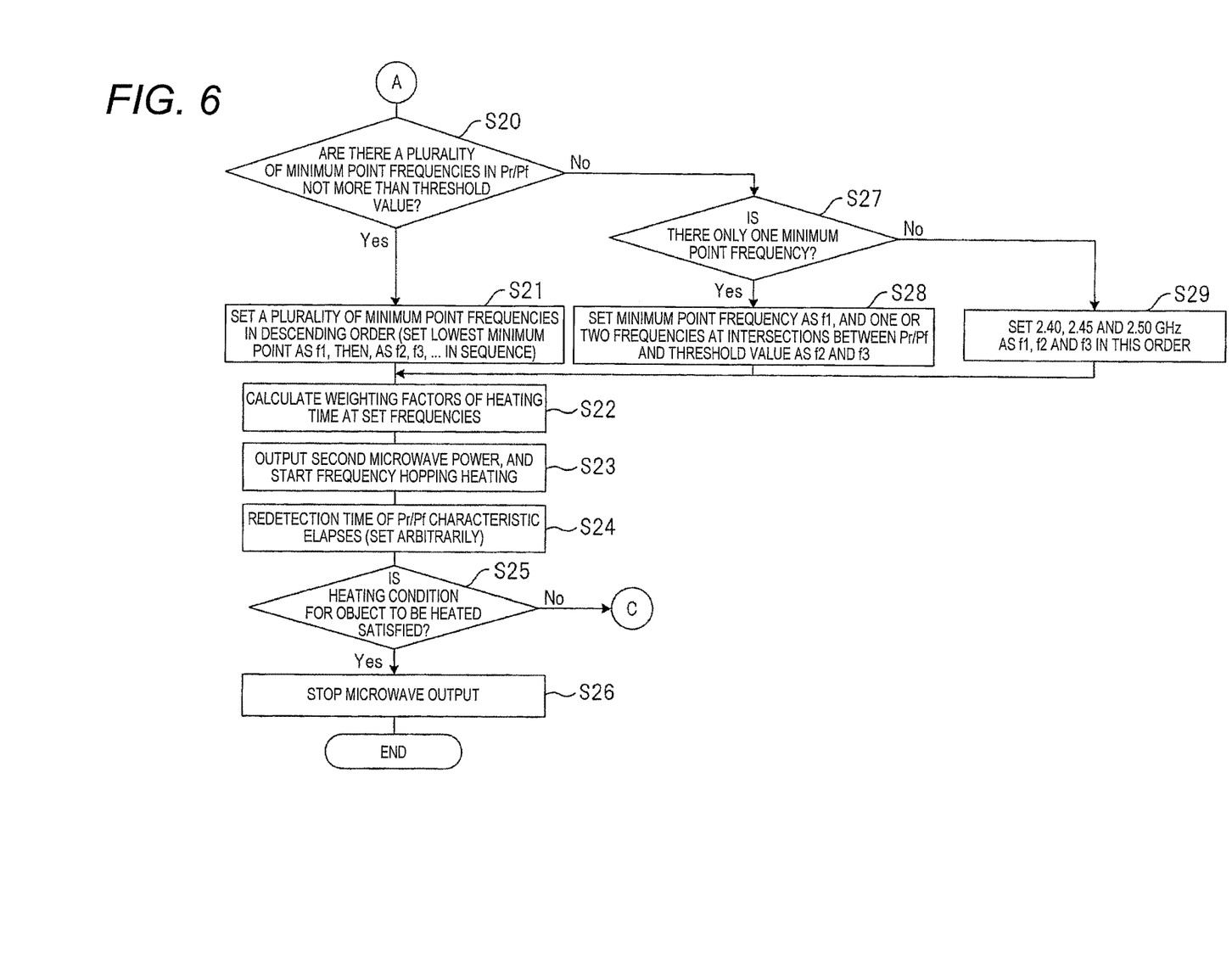
FIG. 6 is a control flowchart of the microwave processing apparatus according to the first embodiment of the present invention.

With respect to the microwave processing apparatus structured as described above, the operation and working thereof will be described with reference to FIG. 5 and FIG. 6.

First, the object to be heated 18 is accommodated in the heating chamber 14, the heating condition is inputted from an operation portion (not shown), and a heating start signal is transmitted to the controller 17 (step S11). Then, the controller 17 operates a drive power source (not shown) based on the information transmitted by step S11, and feeds power to the oscillator 12 (step S12).

At the next step S13, a voltage signal to set the oscillation frequency of the oscillator 12 to the lowest frequency, for example, 2400 MHz is supplied, oscillation is started, and thereafter, the drive power source is controlled to operate the power amplifier 13. At this time, from the power amplifier 13, a first output power, for example, a microwave of less than 10 W is outputted. At the next step S14, the incident power (Pf) fed to the power feeder 15 and the reflected power (Pr) returning from the power feeder 15 to the power detector 16 are detected by the power detector 16, and the detection values are stored at the controller 17. At the next step S15, whether the oscillation frequency has reached the highest frequency, for example, 2500 MHz or not is determined. When the oscillation frequency has not reached 2500 MHz, the process proceeds to step S19, and after a quantity corresponding to a predetermined scan frequency, for example, 1 MHz is added to the oscillation frequency, a microwave is outputted at the updated oscillation frequency, and the process again proceeds to step S14 and step S15. When the oscillation frequency has reached 2500 MHz, the process proceeds to step S16, and the microwave output by the first output power is stopped.

At the next step S17, the Pr/Pf characteristic with the frequency as the variable is calculated from the detection values of the incident power (Pf) and the reflected power (Pr) of each frequency stored at the controller 17. Regarding this Pr/Pf characteristic, the unit is percent: %, and since the lower the value thereof is, the higher the power absorbed into the object to be heated 18 is, the reflected power returning from the power feeder 15 to the power detector 16 is low, which indicates that the heating efficiency for the object to be heated 18 is high. On the other hand, when Pr/Pf is high, since the power absorbed into the object to be heated 18 is low, the reflected power returning from the power feeder 15 to the power detector 16 is high, which indicates that the heating efficiency is low. At the next step S18, a value obtained by adding a predetermined numerical value, for example, 10% to the lowest Pr/Pf value of the Pr/Pf characteristic calculated at the previous step S17 is set as the predetermined threshold value.

At the next step S20, it is determined whether or not there are a plurality of minimum point frequencies in the region not more than the threshold value set at the previous step S18 with respect to the Pr/Pf characteristic. As shown in FIG. 2, when there are a plurality of minimum point frequencies, the process proceeds to step S21, and the frequencies are set as f11, f12, f13, . . . in ascending order. Therefore, this indicates that the frequency where Pr/Pf is the lowest value is set as f11. On the other hand, when there are not a plurality of minimum point frequencies at step S20, the process proceeds to step S27, and it is further determined whether there is only one minimum point frequency or not. As shown in FIG. 3, when there is only one minimum point frequency, the process proceeds to step S28, the minimum point frequency is set as f21, and the intersections of the Pr/Pf characteristic curve and the threshold line on the low frequency side and on the high frequency side are set as f22 and f23, respectively. As shown in FIG. 4, when there is no minimum point frequency, that is, when there is no intersection of the Pr/Pf characteristic curve and the threshold line, the process proceeds to step S29, the lowest frequency of the oscillation frequencies is set as f31, the intermediate frequency between the lowest frequency and the highest frequency is set as f32, and the highest frequency is set as f33. In the following description, a case where the three frequencies f11, f12 and f13 are set as the heating frequencies used for the frequency hopping heating will be described as a representative.

At the next step S22, based on the heating frequencies set at the previous step S21, step S28 and step S29, weighting factors of the heating time at the heating frequencies are calculated. The weighting factor for each heating frequency is designated Bn, and is defined as $Ap(k-n+1)/\Sigma Apn$. Here, Apn is the heated object absorbed power rate for each heating frequency and is defined as $1-(Prn/Pfn)$, and $\Sigma Apn$ is defined as the sum total of Apn. Moreover, n is equal to the value of the units digit of a two-digit number following the heating frequency f set at the previous step S21, step S28 and step S29, and k is equal to the number of the heating frequency. For example, the weighting factor B1 when the heating frequency is f11 is $Ap(3-1+1)/\Sigma Apn=Ap3/(Ap1+Ap2+Ap3)$. Therefore, the heating time of the heating frequency f11 where the reflected power is the lowest, that is, the power absorbed into the object to be heated is the highest is set to the shortest time among the three frequencies since it is proportional to the heated object absorbed power rate Ap3 of the heating frequency f13 where the power absorbed into the object to be heated is the lowest among the set frequencies. On the other hand, the heating time of the heating frequency f13 is set to the longest time since it is proportional to the heated object absorbed power rate Ap1 of the heating frequency f11.

At the next step S23, the oscillation frequency is set to f11, and a second output power, for example, a microwave power of 20 W is outputted. Immediately thereafter, with respect to a predetermined hopping period Th, for example, a period of one second, frequency hopping heating is also started based on the weighting factor calculated by the previous step S22. Generally, frequency hopping is one of the spread spectrum methods used for data communications, and is a technology that enables correction by the data communicated at a different frequency even when noise occurs at a specified frequency, since the signal transmission frequency is successively changed every extremely short time period, for example, every 0.1 second. Here, a microwave heating method in which the object to be heated is heated sequentially at different frequencies by using a plurality of heating frequencies within the hopping period Th will be referred to as frequency hopping heating. Here, the energy Ein absorbed into the object to be heated 18 in the predetermined hopping period Th second is defined as an expression $Pf\cdot\Sigma(Apn\cdot Bn)\cdot Th$, and the unit is joule: J. For example, the heating time of the heating frequency f11 per hopping period is $B1\cdot Th$ second from the above Ein expression.

The frequency hopping heating is repeated for a predetermined redetection time Td, for example, five seconds, of the Pr/Pf characteristic of step S24 which is the next process. After the redetection time Td is reached, the process proceeds to step S25, when the object to be heated 18 satisfies the heating condition set before heating, the process proceeds to step S26, and when the object to be heated 18 does not satisfy, the process returns to step S14, the Pr/Pf characteristic is obtained again, and the series of processes to step S25 are repeated. At step S26, since it is determined that the heating condition for the object to be heated 18 is satisfied at the previous step S25, the second microwave power is stopped, and heating of the object to be heated is ended.

By thus obtaining the reflected power, that is, top several points of the minimum point frequencies of the Pr/Pf characteristic, heating is performed while the reflected power at the time of heating where a predetermined power is outputted is minimized, which enables the object to be heated 18 to efficiently absorb the energy of the microwave. Moreover, since the heating distribution in the heating chamber 14 by the microwave is different among frequencies, the object to be heated can be heated with a plurality of heating distributions by a plurality of set frequencies, so that heating unevenness is reduced. Further, by assigning a weighting factor for each set frequency based on the detected power information, the powers absorbed into the object to be heated at the set heating frequencies per hopping period can be made substantially the same, so that highly accurate uniform heating is realized.

While the present invention has been described in detail with reference to a specific embodiment, it is obvious to one of ordinary skill in the art that various changes and modifications may be added without departing from the spirit and scope of the present invention.

INDUSTRIAL APPLICABILITY

As described above, the microwave processing apparatus according to the present invention, which not only substitutes for an existing microwave oven but also enables uniform heating only by a single antenna and system control, enables the realization of mounting on a built-in kitchen and incorporation into a different apparatus such as a refrigerator and a vending machine on which there are severe mechanical restrictions.

The invention claimed is:

1. A microwave processing apparatus comprising:
    a heating chamber that accommodates an object;
    an oscillator that outputs a source signal at a heating frequency;
    a power amplifier including a semiconductor element that power-amplifies an output of the oscillator;
    a power feeder that feeds an output of the power amplifier to the heating chamber;
    a power detector configured to detect incident power fed from the power amplifier to the power feeder and reflected power reflected from the power feeder to the power amplifier; and
    a controller configured to control an oscillation frequency of the oscillator and the power amplifier,
    wherein the power feeder is disposed at least on a wall surface defining the heating chamber, and
    wherein the controller is further configured to:
        cause the power amplifier to perform a low output operation before start of heating,
        detect the reflected power detected by the power detector while changing the oscillation frequency of the oscillator in a predetermined frequency range,
        determine a plurality of heating frequencies of the oscillator by using several minimum point frequencies of a ratio of incident power and the detected reflected power,
        perform frequency hopping heating within a predetermined unit time for the plurality of heating frequencies, and
        determine a heating time of each heating frequency per a frequency hopping period by a weighting factor obtained based on detected power information of each of the plurality of heating frequencies.
2. The microwave processing apparatus according to claim 1, wherein the controller is further configured to set a predetermined threshold value for the ratio of the incident power to the reflected power calculated from the incident power fed from the power amplifier to the power feeder and the reflected power reflected from the power feeder to the power amplifier, and to select several low points of the ratio of the incident power to the reflected power, within a range not more than the threshold value, as the heating frequencies used for the frequency hopping heating.

3. The microwave processing apparatus according to claim 1, wherein the controller is further configured to perform control operations such that a load incident power for each of the plurality of heating frequencies is the same in the frequency hopping heating using the weighting factor obtained based on the detected power information of each of the plurality of heating frequencies.

* * * * *